(12) United States Patent
Yokoyama (10) Patent No.: US 8,378,388 B2
(45) Date of Patent: Feb. 19, 2013

(54) SEMICONDUCTOR DEVICE HAVING A GAN-BASED SEMICONDUCTOR LAYER DOPED WITH FE

(75) Inventor: Mitsunori Yokoyama, Kanagawa (JP)

(73) Assignee: Sumitomo Electric Device Innovations, Inc., Yokohama-shi, Kanagawa (JP)

( * ) Notice: Subject to any disclaimer, the term of this patent is extended or adjusted under 35 U.S.C. 154(b) by 308 days.

(21) Appl. No.: 12/731,621

(22) Filed: Mar. 25, 2010

(65) Prior Publication Data

US 2010/0244098 A1    Sep. 30, 2010

(30) Foreign Application Priority Data

Mar. 26, 2009   (JP) ................ 2009-076273

(51) Int. Cl.
*H01L 29/778* (2006.01)

(52) U.S. Cl. ............ 257/194; 257/76; 257/E29.246

(58) Field of Classification Search ......... 257/194, 257/76; *H01L 29/778*
See application file for complete search history.

(56) References Cited

U.S. PATENT DOCUMENTS

| | | | | |
|---|---|---|---|---|
| 7,253,454 | B2 * | 8/2007 | Saxler | 257/194 |
| 7,525,130 | B2 * | 4/2009 | Mishra et al. | 257/183 |
| 2005/0263791 | A1 * | 12/2005 | Yanagihara et al. | 257/194 |
| 2008/0113496 | A1 * | 5/2008 | Keller et al. | 438/481 |
| 2008/0258150 | A1 * | 10/2008 | McCarthy et al. | 257/76 |

OTHER PUBLICATIONS

Heikman, Sten, Stacia Keller, Steven P. DenBaars, and Umesh K. Mishra. "Growth of Fe Doped Semi-insulating GaN by Metalorganic Chemical Vapor Deposition." Applied Physics Letters 81.3 (2002): 439.*
Polyakov, A. Y., N. B. Smirnov, A. V. Govorkov, A. V. Markov, T. G. Yugova, A. M. Dabiran, A. M. Wowchak, B. Cui, A. V. Osinsky, P. P. Chow, S. J. Pearton, K. D. Scherbatchev, and V. T. Bublik. "Electrical and Structural Properties of AlN/GaN and AlGaN/GaN Heterojunctions." Journal of Applied Physics 104.5 (2008): 053702.*
Brana, A.F.; Jimenez, A.; Bougrioua, Z.; Azize, M.; Cubilla, P.P.; de Bobadilla, Y.J.F.; Romero, F.; Montojo, M.T.; Verdu, M.; Grajal, J.; Munoz, E.; , "Improved AlGaN/GaN HEMTs using Fe doping," 2005 Spanish Conference on Electron Devices, pp. 119-121, Feb. 2-4, 2005.*
E.A. Douglas, C.Y. Chang, B.P. Gila, M.R. Holzworth, K.S. Jones, L. Liub et al. "Investigation of the effect of temperature during off-state degradation of AlGaN/GaN high electron mobility transistors", Microelectronic Reliability, 52 (2012), pp. 2328.*
S. Heikman et al, "Growth and characteristics of Fe-doped GaN", Journal of Crystal Growth, 2003, pp. 513-517, No. 248.
W. Lee et al, "Optimization of Fe doping at the regrowth interface of GaN for applications to III-nitride-based heterostructure field-effect transistors", Applied Physics Letters, 2007, pp. 093509.1-093509.3, No. 90.

* cited by examiner

*Primary Examiner* — Thomas L Dickey
*Assistant Examiner* — Joseph Schoenholtz
(74) *Attorney, Agent, or Firm* — Westerman, Hattori, Daniels & Adrian, LLP (57) ABSTRACT

A semiconductor device includes: a semiconductor layer made of Fe-doped GaN; a first buffer layer that is provided on the semiconductor layer so as to contact an upper surface of the semiconductor layer and is made of AlN or $Al_xGa_{1-x}N$ (0.4<x<1); and an operating layer that is provided on the first buffer layer and is made of a GaN-based semiconductor.

5 Claims, 6 Drawing Sheets

SEMICONDUCTOR DEVICE HAVING A GAN-BASED SEMICONDUCTOR LAYER DOPED WITH FE

CROSS-REFERENCE TO RELATED APPLICATION

This application is based upon and claims the benefit of priority of the prior Japanese Patent Application No. 2009-076273, filed on Mar. 26, 2009, the entire contents of which are incorporated herein by reference.

BACKGROUND (i) Technical Field

The present invention relates to a semiconductor device, and more particularly, to a semiconductor device having a GaN-based semiconductor layer doped with Fe.

(ii) Related Art

In a semiconductor device with a GaN-based semiconductor containing GaN, there is known a technique for doping GaN with Fe to realize high resistance of the GaN-based semiconductor layer. It is expected that doping of GaN with Fe improves the characteristics of devices such as FET (Field Effect Transistor) and HEMT (High Electron Mobility Transistor). For example, leakage current may be suppressed and the pinch-off characteristic may be improved. Doping of GaN with Fe is described in, for example, S. Heikman et al., "Growth and characteristics of Fe-doped GaN", Journal of Crystal Growth 248 (2003) 513-517, or W. Lee et al., "Optimization of Fe doping at the regrowth interface of GaN for applications to III-nitride-based heterostructure field-effect transistors", Applied Physics Letters 90, 093509 (2007).

SUMMARY OF THE INVENTION

It is an object of the present invention to suppress degradation of the device characteristics due to doping with Fe.

According to an aspect of the present invention, there is provided a semiconductor device including: a semiconductor layer made of Fe-doped GaN; a first buffer layer that is provided on the semiconductor layer so as to contact an upper surface of the semiconductor layer and is made of AlN or $Al_xGa_{1-x}N$ ($0.4<x<1$); and an operating layer that is provided on the first buffer layer and is made of a GaN-based semiconductor.

DETAILED DESCRIPTION

In doping with Fe, there is a possibility that Fe may be precipitated on a surface of a GaN-based semiconductor layer at the time of growing the GaN-based semiconductor layer, as described in the above-described papers. In this process, precipitated Fe may be entrapped in an operating layer formed on the GaN-based semiconductor layer (slow turn off behavior). In the process of growing the operating layer, Fe may be grown due to gas that remains in the chamber and contains Fe (memory effect).

In a case where the operating layer is doped with Fe having a high concentration, carriers in the operating layer are trapped by Fe. This may decrease the mobility due to degradation of the concentration of the two-dimensional electron gas and impurity scattering. That is, doping with Fe originally directed to improving the device characteristics may degrade the device characteristics on the contrary to the expected effect. The degradation of the device characteristics may be restrained by restricting the amount of Fe with which the semiconductor layer is doped. However, considerable improvement in the device characteristics may not be obtained.

According to an aspect of an embodiment described below, it is possible to suppress degradation of the device characteristics due to doping with Fe.

An experiment conducted by the inventor is now described.

Figure 1A:
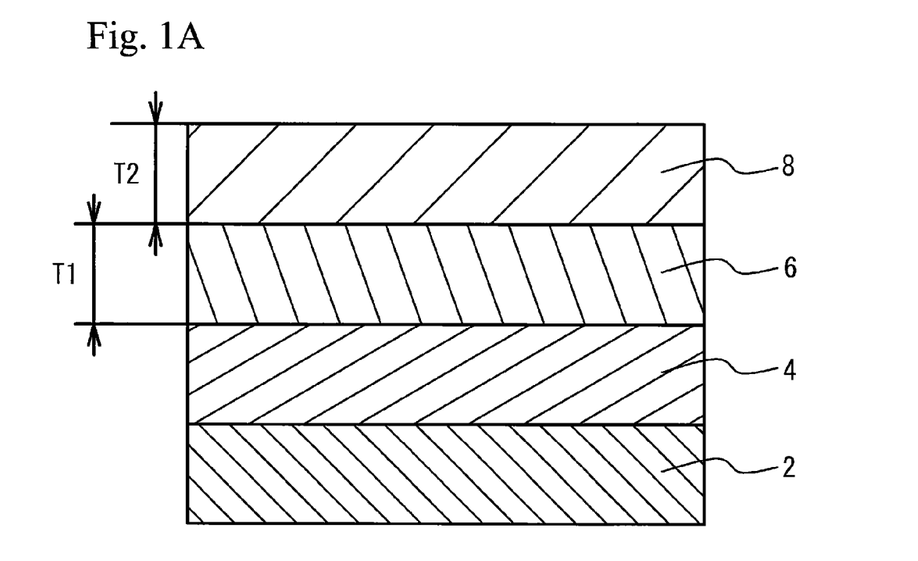
FIG. 1A is a cross-sectional view of a sample A.
Figure 1B:
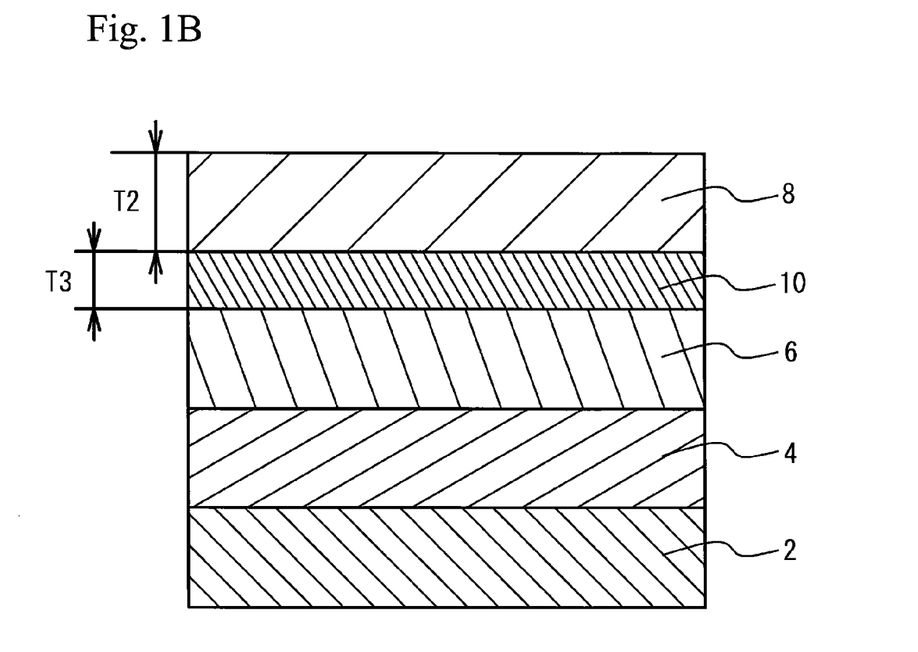
FIG. 1B is a cross-sectional view of a sample B.

Samples used in the experiment are described with reference to the drawings. FIG. 1A is a cross-sectional view of a sample A, and FIG. 1B is a cross-sectional view of a sample B. First, sample A is described.

Referring to FIG. 1A, a buffer layer 4 made of AlN (aluminum nitride) is formed on a substrate 2 made of silicon carbide (SiC). A semiconductor layer 6 made of GaN (gallium nitride) and doped with Fe is provided on the buffer layer 4. The sample A has a semiconductor layer 8 (another semiconductor layer), which contacts the upper surface of the semiconductor layer 6 and is made of GaN undoped with Fe (undoped GaN). The semiconductor layer 6 has a thickness T1 of 630 nm, and the semiconductor layer 8 has a thickness T2 of 780 nm.

Referring to FIG. 1B, the sample B has a first buffer layer 10, which contacts the upper surface of the semiconductor layer 6 and is made of AlN. The semiconductor layer 8 is provided on the first buffer layer 10. The semiconductor layer 8 contacts the upper surface of the first buffer layer 10 but does not contact the semiconductor layer 6. That is, the first buffer layer 10 is sandwiched between the semiconductor layer 6 and the semiconductor layer 8. The semiconductor layer 8 has a thickness T2 of 630 nm, and the first buffer layer has a thickness T3 of 150 nm. In FIG. 1B, parts that are the same as those in FIG. 1A are given the same reference numerals, and a description thereof is omitted here.

The samples A and B were fabricated as follows. MOVPE (MetalOrganic Vapor Phase Epitaxy) was used to epitaxially grow layers. Sources for GaN and Al were as follows. A source for growing GaN in the semiconductor layers 6 and 8 was TMGa (trimethylgallium) and NH3 (ammonia). A source for Al in AlN used to form the buffer layer 4 and the first buffer layer 10 was TMAl (trimethylaluminum). A source for Fe with which the semiconductor layer 6 is doped was ferrocene ($Cp_2Fe$: Cyclopentadienyl iron). The concentration of Fe used at the time of forming the semiconductor layer 6 was $1.2 \times 10^{18}$-$1.5 \times 10^{18}$ $cm^{-3}$. The conditions for growing GaN and AlN were as follows. A carrier gas of $N_2$ was used, and the growth pressure was 100 torr. The growth temperature was 1050° C., and the partial pressure of $NH_3$ was 40 torr.

The contents of the experiment are as follows. In the experiment, each sample was subjected to SIMS (Secondary Ion-microprobe Mass Spectrometer), and the concentration of Fe in the depth direction was measured.

Figure 2A:
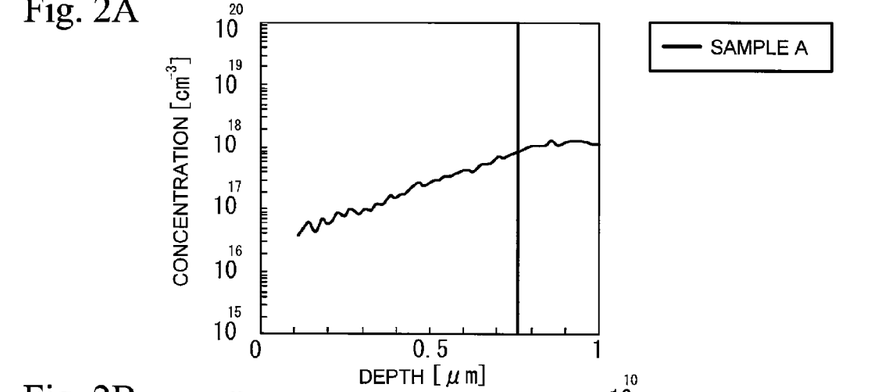
FIG. 2A illustrates a result of a SIMS analysis of the sample A.

The results of the experiments for the samples A and B are now described with reference to the drawings. FIG. 2A is a graph of a result of the SIMS analysis of the sample A. The horizontal axis denotes the depth (μm) from the sample surface, and the vertical axis denotes the concentration ($cm^{-3}$) of Fe. A right-hand side portion of a solid line indicates the semiconductor layer 6 doped with Fe, and a left-hand side portion thereof indicates the semiconductor layer 8 undoped with Fe.

As illustrated in FIG. 2A, the concentration of Fe in the semiconductor layer 6 is approximately $1 \times 10^{18}$ $cm^{-3}$, and a similar value is observed at the interface (solid line) between the semiconductor layer 6 and the semiconductor layer 8. As the depth decreases (farther from the semiconductor layer 6), the concentration of Fe decreases gradually.

It is considered that the above results from a mechanism in which Fe with which the semiconductor layer 6 is doped is precipitated on the surface of the semiconductor layer 6 and is entrapped in the semiconductor layer 8 at the time of growing.

Figure 2B:
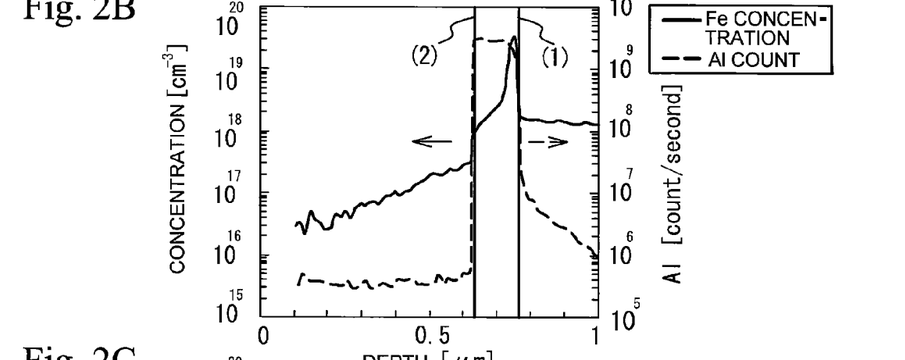
FIG. 2B is a result of a SIMS analysis of the sample B.

A result of the experiment for the sample B is now described. FIG. 2B is a graph of a result of the SIMS analysis of the sample B. The vertical axis on the left-hand side and a solid line respectively indicate the concentration ($cm^{-3}$) of Fe. The vertical axis of the right-hand side and a broken line respectively indicate an Al count (count/second). A right-hand side portion of a solid line (1) indicates the semiconductor layer 6 doped with Fe, and a left-hand side portion of another solid line (2) indicates the semiconductor layer 8 undoped with Fe. A section between the solid lines (1) and (2) indicates the first buffer layer 10.

As illustrated in FIG. 2B, the Al count and the Fe concentration rises abruptly at the interface (solid line (1)) between the semiconductor layer 6 and the first buffer layer 10. As the depth decreases, the Fe concentration decreases gradually, and the Al count and the Fe concentration decrease abruptly at the interface (solid line (2)) between the first buffer layer 10 and the semiconductor layer 8.

Figure 2C:
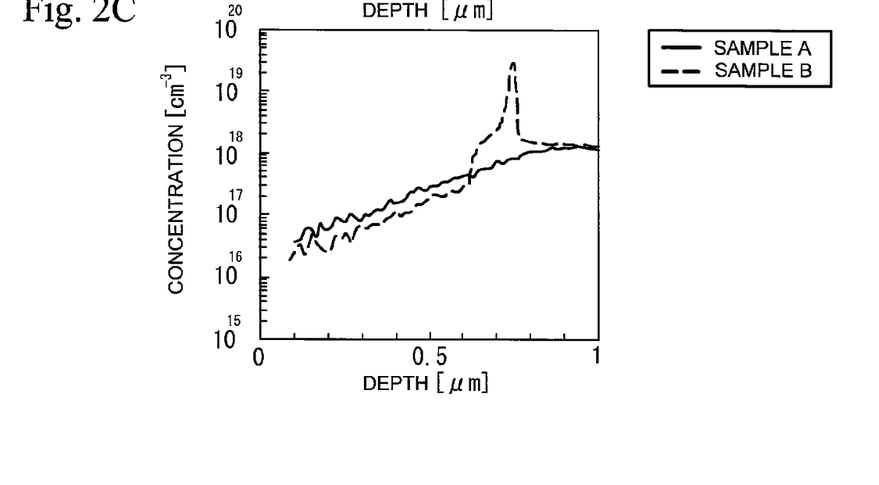
FIG. 2C illustrates the results of the SIMS analysis of the samples A and B together.

The results of the measurements of the Fe concentrations of the samples A and B are compared with each other. FIG. 2C illustrates the results of the SIMS analysis of the samples A and B together.

Referring to FIG. 2C, the Fe concentration of the semiconductor layer 8 of the sample B is lower than that of the sample A. For example, the Fe concentration of the sample A is approximately $4 \times 10^{18}$ $cm^{-3}$ at a depth of about 0.5 μm, while the Fe concentration of the sample B is approximately $2 \times 10^{17}$ $cm^{-3}$ at a depth of about 0.5 μm. It can be seen from FIGS. 3A through 3C that the Fe concentration decreases as the depth decreases.

It is considered that the decrease in the Fe concentration of the sample B results from suppress of entrapment of Fe in the semiconductor layer 8 as compared to the sample A since Fe precipitated on the surface of the semiconductor layer 6 is entrapped at the interface between the first buffer layer 10 and the semiconductor layer 6 and decreases gradually as the depth decreases.

A description will now be given of an experiment that used a sample (sample C) having a different thickness of the first buffer layer 10 and another sample (sample D) having multiple buffer layers.

The sample C is described (see FIG. 1B). The sample C has a specification such that the thickness T2 of the semiconductor layer 8 is set equal to 480 nm and the thickness T3 of the first buffer layer 10 is set equal to 300 nm. The other structures of the sample C are the same as those of the sample B.

The sample D is described with reference to a cross-sectional view of FIG. 3A.

Figure 3A:
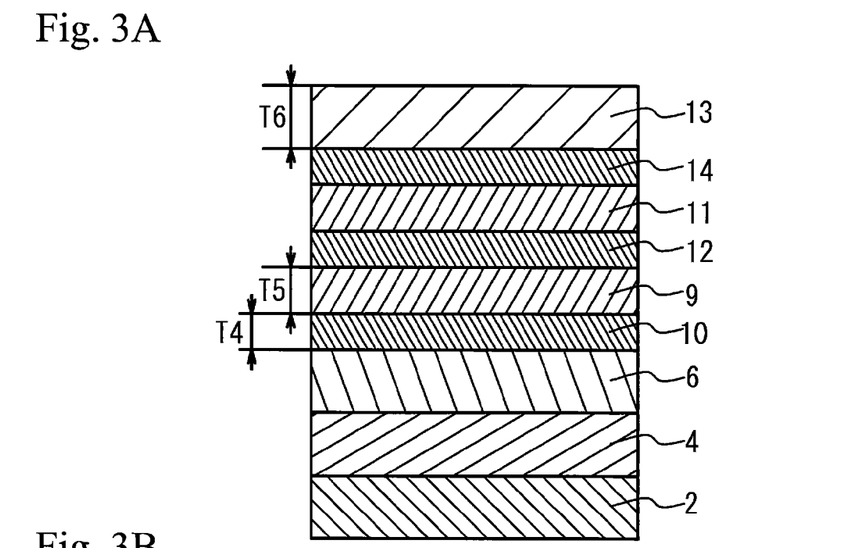
FIG. 3A is a cross-sectional view of sample D.

Referring to FIG. 3A, an intermediate layer made of undoped GaN is formed on the first buffer layer 10, and a second buffer layer 12 made of AlN is provided on the intermediate layer 9. In other words, the second buffer layer 12 is provided on (more particularly, above) the first buffer layer 10 so as to overlap the first buffer layer 10, and the intermediate layer 9 is sandwiched between the first buffer layer 10 and the second buffer layer 12. The intermediate layer 9 contacts the upper surface of the first buffer layer 10, and the second buffer layer 12 contacts the upper layer of the intermediate layer 9.

An intermediate layer 11 (another intermediate layer) made of undoped GaN is provided on the second buffer layer 12, and a second buffer layer 14 is provided on the intermediate layer 11. In other words, the multiple second buffer layers 12 and 14 are alternately stacked on the first buffer layer 10, and the intermediate layer 11 is interposed between the second buffer layers 12 and 14. A semiconductor layer 13 (another semiconductor layer) made of undoped GaN is provided on the second buffer layer 14. The intermediate layer 11 contacts the upper surface of the second buffer layer 12, and the second buffer layer 14 contacts the upper surface of the intermediate layer 11. The semiconductor layer 13 contacts the second buffer layer 14. That is, the first buffer layer 10 and the multiple second buffer layers 12 and 14 are interposed between the semiconductor layer 6 and the semiconductor layer 13.

In the sample D, the first buffer layer 10 and the second buffer layers 12 and 14 have a thickness T4 of 50 nm. The intermediate layers 9 and 11 have a thickness T5 of 100 nm, and the semiconductor layer 13 has a thickness T6 of 430 nm.

Figure 3B:
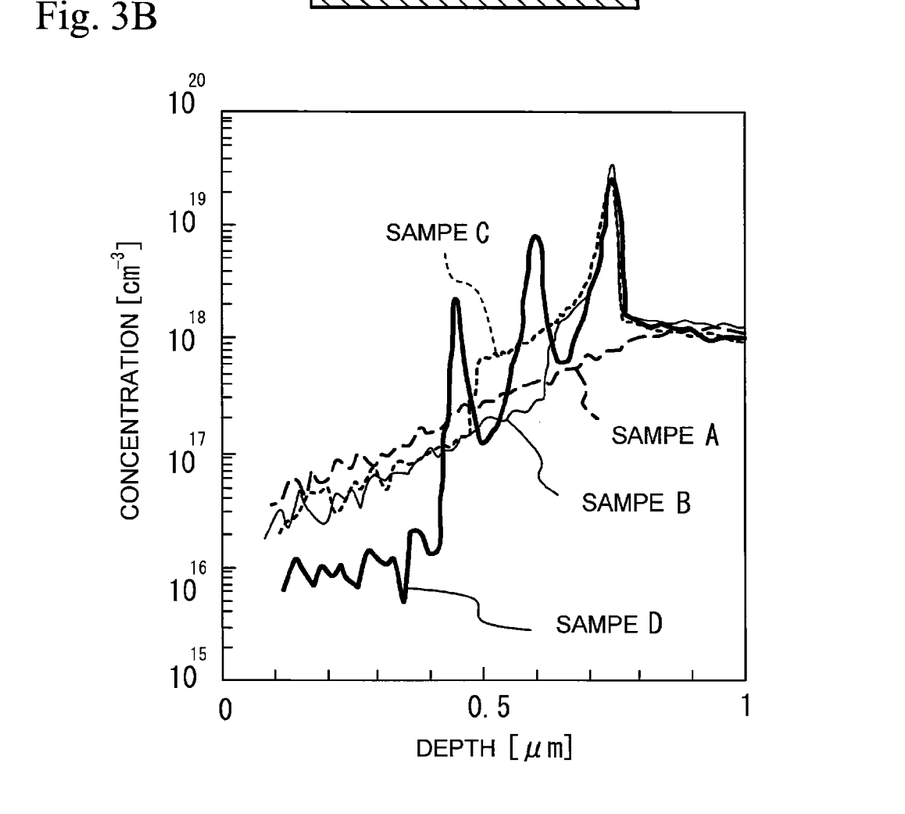
FIG. 3B illustrates results of a SIMS analysis of the samples A, B, C and D together.

A description will now be given of results of the experiment with reference to the drawings. FIG. 3B illustrates the SIMS analysis of the samples A, B, C and D together. A broken line indicates the sample A, and a thin solid line indicates the sample B. Further, a dotted line indicates the sample C, and a thick solid line indicates the sample D. The results of the experiment for the samples A and B are the same as those illustrated in FIG. 2C.

Referring to FIG. 3B, the Fe concentration of the sample C at the interface between the semiconductor layer 6 and the first buffer layer 10 (at a depth of about 0.7 μm) increases abruptly, and decreases gradually as the depth decreases. A similar change is observed in the sample B. Further, the Fe concentration decreases at the interface between the first buffer layer 10 and the semiconductor layer 8. In the semiconductor layer 8 (which is shallower than 0.4 μm), the samples C and B have almost identical Fe concentrations.

Even in the sample D, the Fe concentration of the sample C at the interface between the semiconductor layer 6 and the first buffer layer 10 increases abruptly, and decreases gradually as the depth decreases. A similar change is observed in the samples B and C. Further, in the sample D, the Fe concentration increases at the interface between the intermediate layer 9 and the second buffer layer 12 and at the interface between the intermediate layer 11 and the second buffer 14. However, the whole trend is such that the Fe concentration decreases greatly as the depth decreases. Particularly, the Fe concentration decreases abruptly at the interface between the second buffer layer 14 and the semiconductor layer 13. For example, at a depth of about 0.3 μm, the Fe concentration for the sample A is approximately $1 \times 10^{17}$ $cm^{-3}$, and those for the samples B and C are approximately 5×10$^{16}$ cm$^3$. In contrast, the Fe concentration for the sample d is approximately 1×10$^{16}$ cm$^{-3}$.

As in the case of the sample C, even when the thickness of the first buffer layer 10 is increased, the effect of suppressing the entrapment of Fe is not changed greatly. In contrast, as in the case of the sample D, the considerable effect of suppressing the entrapment of Fe is obtained by providing the multiple AlN layers (which include the first buffer layer 10, and the second buffer layers 12 and 14) and form the multiple interfaces between the AlN layers and the GaN layers (the semiconductor layers 6 and 13 and the intermediate layers 9 and 11).

It can be seen from FIGS. 2B, 2C and 3B that the Fe concentration increases at the interfaces between the GaN layer and the AlN layers. As indicated by the experimental result of the sample D illustrated in FIG. 3B, the enhanced effect of suppressing the entrapment of Fe in the semiconductor layer 8 is obtained by forming the multiple interfaces between the AlN layers and the GaN layers. This may result from a phenomenon such that Fe precipitated on the surface of the GaN layer is confined at the interfaces with the AlN layers and entrapment of Fe in the semiconductor layer 8 is suppressed.

An experiment using a sample having the buffer layer made of a different material is now described. This sample is referred to as sample E.

Figure 4:
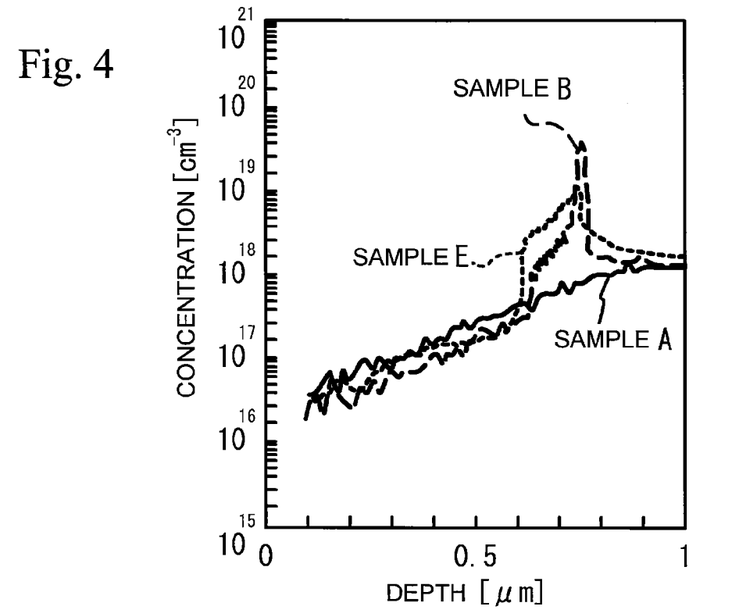
FIG. 4 illustrates results of a SIMS analysis of the samples A, B and E.

The first buffer layer 10 of the sample E is made of Al0.5Ga0.5N. The sample E is the same as the sample B except the material of the first buffer layer 10 (see FIG. 2B). A result of the experiment for the sample E is described below. FIG. 4 illustrates the results of experiments for the samples A, B and E together. In FIG. 4, a solid line indicates the experimental result of the sample A, and a broken line indicates that for the sample B, while a dotted line indicates the experimental result of sample E.

As illustrated in FIG. 4, in the sample E, the Fe concentration rises abruptly at the interface between the semiconductor layer 6 and the first buffer layer 10 (at a depth of about 0.7 μm), and decreases gradually as the depth decreases, as in the case of the sample B. The rate of gradual decrease in the Fe concentration is less than that of the sample B. That is, for the first buffer layer 10 of Al$_{0.5}$Ga$_{0.5}$N, the entrapment of Fe in the semiconductor layer 8 is suppressed, although the effect of suppression is not as great as that for the first buffer layer of AlN.

Now, embodiments of the present invention are described.

First Embodiment

Figure 5:
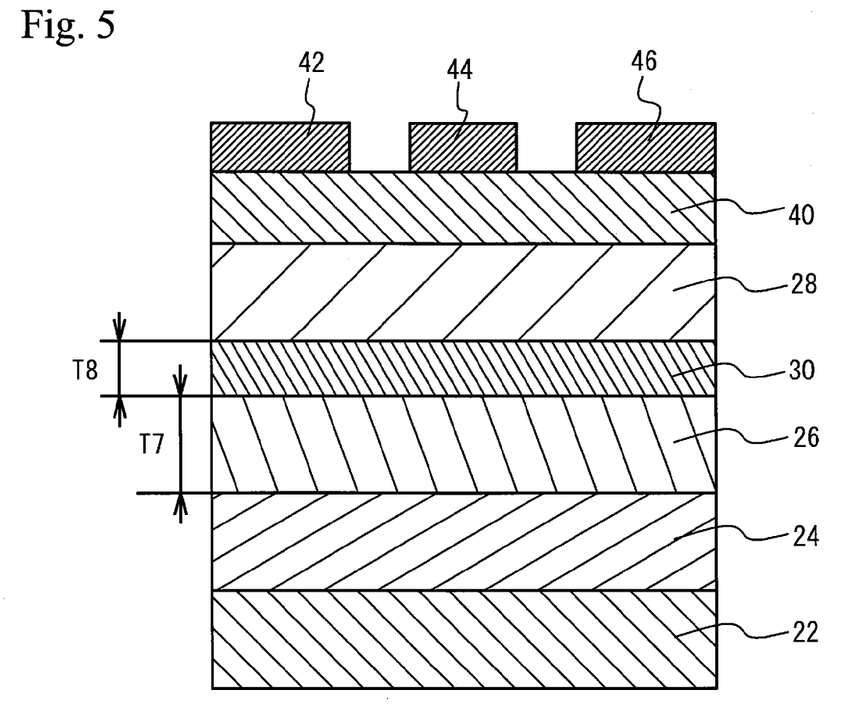
FIG. 5 is a cross-sectional view of a semiconductor device in accordance with a first embodiment.

A first embodiment is a HEMT equipped with the first buffer layer. FIG. 5 is a cross-sectional view of a semiconductor device in accordance with the first embodiment.

Referring to FIG. 5, a buffer layer 24 made of, for example AlN is formed on a substrate 22 made of, for example, SiC. A semiconductor layer 26 made of GaN doped with Fe is provided on the buffer layer 24. A first buffer layer 30 made of, for example, AlN is provided on the semiconductor layer 26 so as to contact the upper surface thereof. The semiconductor layer 26 has a thickness T7 of, for example, 200 nm, and the first buffer layer 30 has a thickness T8 of, for example, 100 nm. The semiconductor layer 26 has an Fe concentration of 1×10$^{18}$ cm$^{-3}$. An operating layer (another semiconductor layer) 28 made of, for example, undoped GaN is formed on the first buffer layer 30. A supply layer 40, which has a carrier concentration of 5×10$^{18}$ cm$^{-3}$ and is made of, for example, n-type Al$_x$Ga$_{1-x}$N (x is equal to, for example, 0.25) is provided on the operating layer 28. On the supply layer 40, provided are a source electrode 42, a gate electrode 44 and a drain electrode 46. The source electrode 42 and the drain electrode 46 have a multilayer structure of, for example, Ti/Al/Ti/Au in which the leftmost Ti is closest to the supply layer 40. The gate electrode 44 has a multilayer structure of, for example, Ni/Au in which Ni is closer to the supply layer 40. The operating layer 28 is not in contact with the semiconductor layer 26. That is, the first buffer layer 30 is sandwiched between the semiconductor layer 26 and the operating layer 28.

The aforementioned methods for fabricating the samples A and B (the sources and conditions for GaN and AlN) may be applied to the semiconductor device of the first embodiment. Other sources or conditions may be employed.

A sequence of epitaxial growth is described. The first step is to form the AlN layer, or the buffer layer 24 on the substrate 22. The second step is to form the Fe-doped GaN layer, that is, the semiconductor layer 26 on the buffer layer 24 so as to have a thickness of 200 nm. The third step is to form the AlN layer, or the first buffer layer 30 on the semiconductor layer 26 so as to have a thickness of 100 nm. The fourth step is to form the undoped GaN layer, or the operating layer 28 on the first buffer layer 30. The fifth step is to form the n-type Al$_x$Ga$_{1-x}$N layer, or the supply layer 40 on the operating layer 28.

According to the first embodiment, the first buffer layer 30 is provided so as to contact the upper surface of the semiconductor layer 26, and the operating layer 28 is provided on the first buffer layer 30. Thus, it is possible to suppress the entrapment of Fe in the operating layer 28 during the growth of the operating layer 28. This makes it possible to prevent Fe from trapping the carrier in the operating layer 28 and to restrain degradation of the characteristics of the semiconductor device. The quantity of doping of Fe may not be limited taking precipitation of Fe into consideration. Thus, the semiconductor layer 26 having high resistance is obtained and the device characteristics are improved.

The thickness T8 of the first buffer layer 30 is not limited to 100 nm but may be changed. As the first buffer layer 30 becomes thicker, there is an increasing possibility that a crack takes place in the first buffer layer 30 due to the lattice mismatch with the semiconductor layer 26. It is thus preferable that the thickness T8 of the first buffer layer 30 is less than or equal to 300 nm. As indicated by the sample C in FIG. 3B, entrapment of Fe may be suppressed when the thickness T8 of the first buffer layer 30 is 300 nm or less. In a case where the first buffer layer 30 is thickened over a thickness that allows the first buffer layer 30 to function as a buffer layer, an increased amount of source is consumed and the production cost is increased. When the first buffer layer 30 is designed to have a desired thickness, the production cost may be reduced. In order to realize the cost reduction and process efficiency, the thickness T8 of the first buffer layer 30 is preferably equal to or less than 200 nm, and is more particularly, 150 nm or less. If the first buffer layer 30 is too small, the barrier effect for AlN will be degraded. In order to stably obtain the barrier effect, it is preferable that the thickness T8 of the first buffer layer 30 is equal to or greater than 4 nm, and is more preferably equal to or greater than 50 nm. As indicated by the sample D in FIG. 3B, in a case where the first buffer layer 30 is 50 nm thick or greater, the effect of suppression of entrapment of Fe is obtained.

As indicated by the result of the experiment for the sample E in FIG. 4, in a case where Al$_x$Ga$_{1-x}$N is used, the effect of suppressing entrapment of Fe is obtained although the effect is not as great as that obtained when AlN is used. Thus, the first buffer layer 30 may be made of Al$_x$Ga$_{1-x}$N. In this case, if the concentration of Al is low, a sufficient effect may not be obtained. Thus, it is preferable that x is equal to or greater than 0.4. More preferably, x is equal to or greater than 0.5 in order to obtain greater effect of suppressing entrapment of Fe. As indicated by the sample E in FIG. 4, it is confirmed that the effect of suppressing entrapment of Fe is obtained when x=0.5 in $Al_xGa_{1-x}N$. In order to improve the device characteristics by increasing the resistance of the semiconductor layer 26, it is preferable that the concentration of Fe used to dope the semiconductor layer 26 is equal to or greater than $1\times10^{17}$ cm$^3$. In order to further enhance the effect, it is preferable that the Fe concentration is equal to or greater than $1\times10^{18}$ cm$^{-3}$.

The operating layer 28 is not limited to undoped GaN but may be made of a GaN-based semiconductor. The GaN-based semiconductor is a semiconductor that includes Ga and N, and may be GaN, InGaN, AlGaN, and InAlGaN. When AlGaN or InAlGaN is used, the composition ratio of Al included in the operating layer 28 is less than that of Al included in the first buffer layer 30. The substrate 22 is not limited to SiC but may be made of sapphire, GaN or Si. A GaN template substrate may be used as the substrate 22.

Second Embodiment

Figure 6:
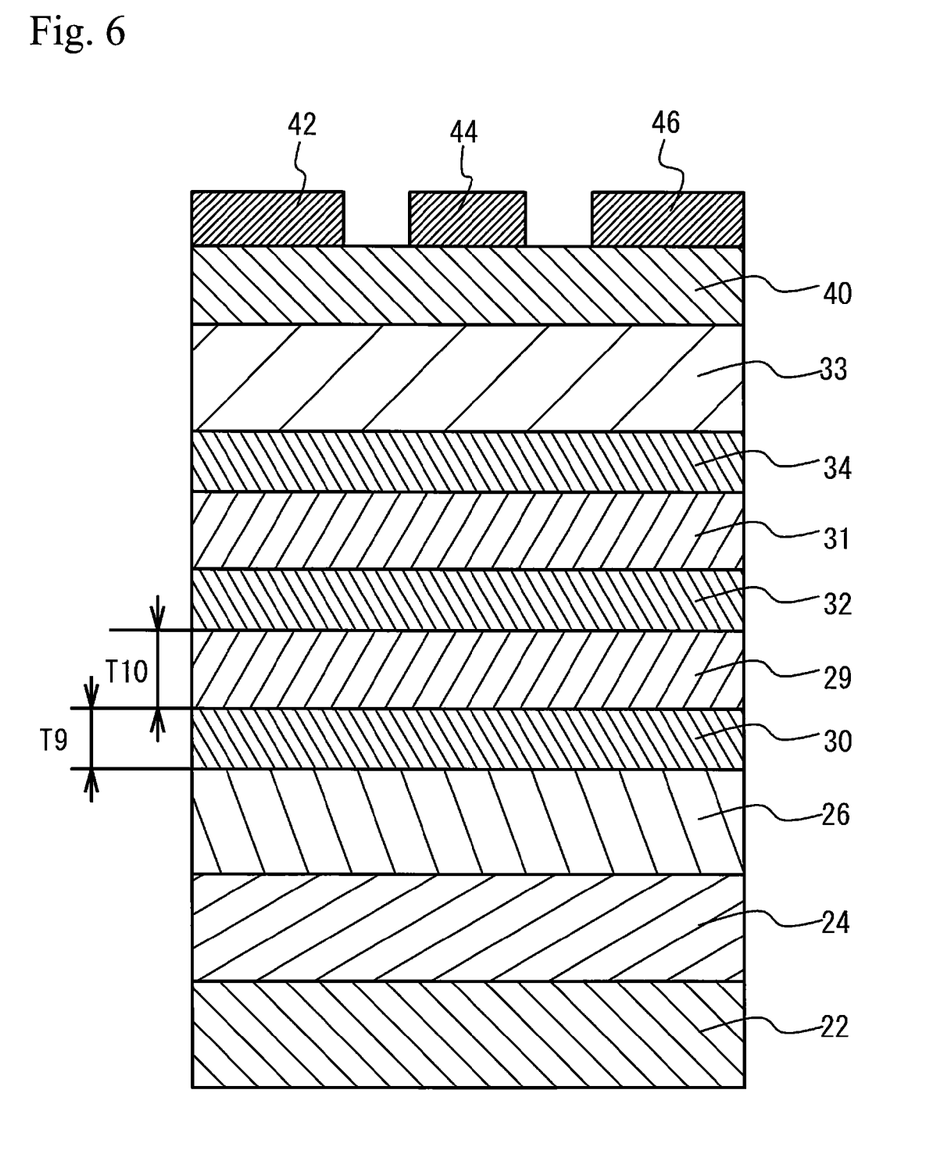
FIG. 6 is a cross-sectional view of a semiconductor device in accordance with a second embodiment.

A second embodiment is a HEMT with multiple buffer layers. FIG. 6 is a cross-sectional view of a semiconductor device in accordance with the second embodiment. Parts that are the same as those illustrated in FIG. 5 are given the same reference numerals, and a description thereof is now omitted.

As illustrated in FIG. 6, an intermediate layer 29 made of, for example, undoped GaN is provided on the first buffer layer 30, and a second buffer layer 32 made of, for example, AlN is provided on the intermediate layer 29. In other words, the second buffer layer 32 is provided so as to overlap the first buffer layer 30, and the intermediate layer 29 is sandwiched between the first buffer layer 30 and the second buffer layer 32. The intermediate layer 29 contacts the upper surface of the first buffer layer 30, and the second buffer layer 32 contacts the upper surface of the second buffer layer 32.

An intermediate layer 31 made of, for example, undoped GaN is provided on the second buffer layer 32. A second buffer layer 34 is provided on the intermediate layer 31. In other words, the multiple second buffer layers 32 and 34 are provided on the first buffer layer 30 so as to overlap each other, and the intermediate layer 31 is provided between the second buffer layers 32 and 34. An operating layer (another semiconductor layer) 33 made of undoped GaN is provided on the second buffer layer 34. The intermediate layer 31 contacts the upper surface of the second buffer layer 32, and the second buffer layer 34 contacts the upper surface of the intermediate layer 31. The operating layer 33 contacts the upper surface of the second buffer layer 34. That is, the first buffer layer 30 and the second buffer layers 32 and 34 are provided between the semiconductor layer 26 and the operating layer 33. As described above, the second embodiment has the multiple second buffer layers and the multiple intermediate layers.

The first buffer layer 30 and the second buffer layers 32 and 34 have a thickness T9 of, for example, 50 nm. The intermediate layers 29 and 31 have a thickness T10 of, for example, 100 nm.

According to the second embodiment, the multiple buffer layers (the first buffer layer 30 and the second buffer layers 32 and 34) are provided to define the multiple interfaces with the GaN layers (the semiconductor layer 26, the intermediate layers 29 and 31 and the operating layer 33). Thus, the great effect of suppressing entrapment of Fe can be obtained. It is thus possible to reliably suppress degradation of the characteristics of the semiconductor device.

The buffer layer in FIG. 6 is composed of three layers. Even the buffer layer is composed of only two layers, the effect of suppressing entrapment of Fe is obtained. Yet another structure may be used in which the buffer layer is composed of four layers or more and intermediate layers are provided between adjacent second buffer layers. With this structure, the effect of suppression may be enhanced. The intermediate layers 29 and 31 are not limited to undoped GaN but may be made of a GaN-based semiconductor of $Al_{x1}In_{y1}Ga_{1-x1-y1}N$ (x1+y1≦1). In the case where the intermediate layers 29 and 31 are made of AlGaN or InAlGaN, the Al composition ratios of the first buffer layer 30, and the second buffer layers 32 and 34 are preferably larger than those of the intermediate layers 29 and 31. This is cause the effect of suppressing entrapment of Fe may depend on the difference in Al composition ratio between the buffer layer and the intermediate layer.

As in the case of the first buffer layer 30, in order to prevent a crack from occurring in the second buffer layers 32 and 34, the thickness T9 of the second buffer layers 32 and 34 is equal to or less than 300 nm. In terms of efficiency in the process, the thickness T9 of the second buffer layers 32 and 34 is preferably equal to or less than 200 nm, and is more preferably equal to or less than 150 nm. In order to realize stabilized growth, the thickness T9 of the second buffer layers 32 and 34 is preferably equal to or greater than 4 nm, and is more preferably equal to or greater than 50 nm. In the first and second embodiments, the AlN or AlGaN barrier layers are successively grown on the Fe-doped GaN layer. The present invention includes another embodiment using a template substrate on which an Fe-doped GaN layer and underlying layers are formed, and AlN is regrown on the template substrate. In this embodiment, similar advantages are obtained.

Third Embodiment

Figure 7:
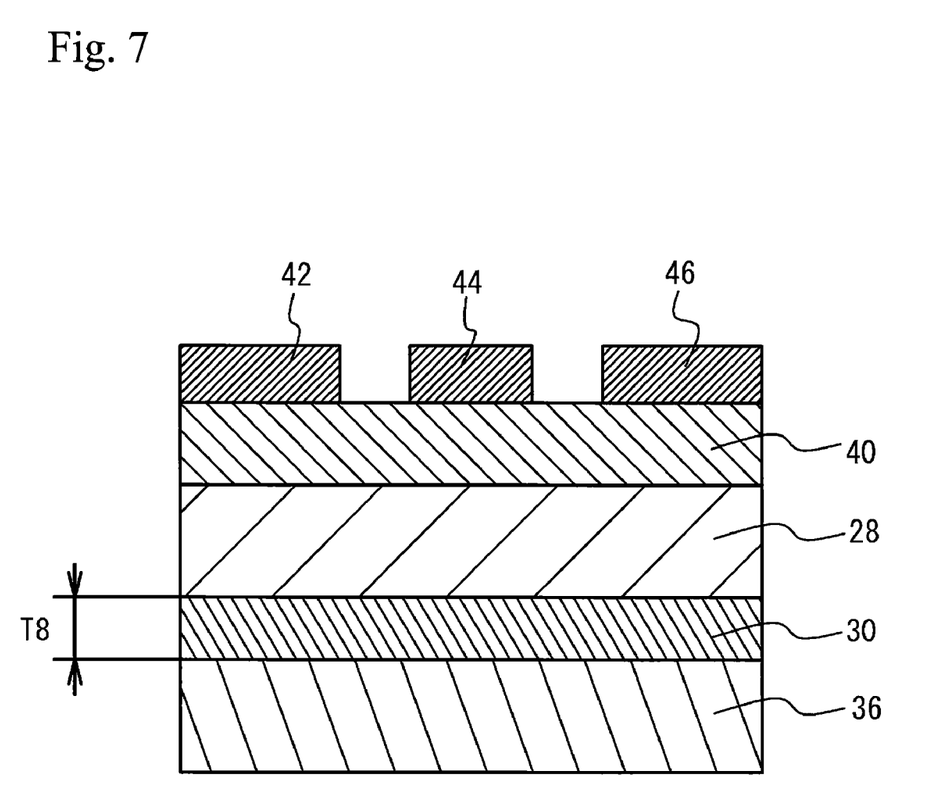
FIG. 7 is a cross-sectional view of a semiconductor device in accordance with a third embodiment.

A third embodiment is a HEMT using a semiconductor substrate that is a semiconductor layer made of Fe-doped GaN. FIG. 7 is a cross-sectional view of a semiconductor device in accordance with the third embodiment. In FIG. 7, parts that are the same as those illustrated in FIG. 5 are given the same reference numerals.

Referring to FIG. 7, the first buffer layer 30 is provided so as to contact the upper surface of a semiconductor substrate made of Fe-doped GaN, and the operating layer 28 is provided on the first buffer layer 30. The thickness of the first buffer layer 30 is 100 nm, for example.

According to the third embodiment, since the first buffer layer 30 is provided on the semiconductor substrate 36, it is possible to suppress Fe precipitated on the surface of the first buffer layer 30 from being entrapped in the operating layer 28 at the time of growing the operating layer 28. Thus, even when Fe-doped GaN is used to form the semiconductor substrate, it is possible to suppress the characteristics of the semiconductor device from being degraded.

The first, second and third embodiments are not limited to HEMT but may include other types of FET such as MOSFET (Metal Oxide Semiconductor FET) or MESFET (Metal Semiconductor FET). It is possible to suppress the characteristics of HEMT and FET from being degraded due to entrapment of Fe in the operating layer.

The present invention is not limited to the specifically disclosed embodiments and variations, but may include other embodiments and variations departing from the scope of the present invention.

What is claimed is:

1. A semiconductor device comprising:
a semiconductor layer made of Fe-doped GaN;
a first buffer layer that is provided on the semiconductor layer so as to contact an upper surface of the semiconductor layer and is made of AlN;
an operating layer that is provided on the first buffer layer and is made of a GaN-based semiconductor,
wherein the semiconductor layer is a single layer, and,
wherein the first buffer layer has a thickness that is equal to or greater than 50 nm and is equal to or less than 300 nm.

2. A semiconductor device comprising:
a semiconductor layer made of Fe-doped GaN;
a first buffer layer that is provided on the semiconductor layer so as to contact an upper surface of the semiconductor layer and is made of AlN;
an operating layer that is provided on the first buffer layer and is made of a GaN-based semiconductor,
a second buffer layer that is provided on the first buffer layer and is made of AlN or $Al_xGa_{1-x}N$ ($0.4<x<1$);
an intermediate layer that is provided between the first and second buffer layers and is made of $Al_{x1}In_{y1}Ga_{1-x1-y1}N$ ($x1+y1 \leqq 1$) having an Al composition ratio smaller than Al composition ratios of the first and second buffer layers,
wherein the semiconductor layer is a single layer, and the operating layer is provided on the second buffer layer.

3. The semiconductor device according to claim 2, wherein the second buffer layer includes multiple second buffer layers, and the intermediate layer includes multiple intermediate layers.

4. The semiconductor device according to claim 1, wherein the semiconductor device is a HEMT or FET.

5. The semiconductor device according to claim 2, wherein x of $Al_xGa_{1-x}N$ is equal to or greater than 0.5.

* * * * *